(12) United States Patent
Teman et al.

(10) Patent No.: US 8,773,895 B2
(45) Date of Patent: Jul. 8, 2014

(54) ULTRA LOW POWER MEMORY CELL WITH A SUPPLY FEEDBACK LOOP CONFIGURED FOR MINIMAL LEAKAGE OPERATION

(71) Applicant: Ben-Gurion University of the Negev Research and Development Authority, Beer-Sheva (IL)

(72) Inventors: Adam Teman, Ramat Gan (IL); Lidor Pergament, Tel Aviv-Yafo (IL); Omer Cohen, Rishon LeZiyyon (IL); Alexander Fish, Tel Mond (IL)

(73) Assignee: Ben-Gurion University of the Negev Research and Development Authority, Beer-Sheva (IL)

( * ) Notice: Subject to any disclaimer, the term of this patent is extended or adjusted under 35 U.S.C. 154(b) by 0 days.

(21) Appl. No.: 13/777,085

(22) Filed: Feb. 26, 2013

(65) Prior Publication Data

US 2013/0170310 A1    Jul. 4, 2013

Related U.S. Application Data

(63) Continuation of application No. 13/103,093, filed on May 8, 2011, now abandoned.

(51) Int. Cl.
*G11C 11/413* (2006.01)
(52) U.S. Cl.
USPC .......................................... 365/154; 365/156
(58) Field of Classification Search
USPC .............................. 365/154, 156, 188, 189.04
See application file for complete search history.

(56) References Cited

U.S. PATENT DOCUMENTS

| | | | |
|---|---|---|---|
| 5,668,770 A | 9/1997 | Itoh et al. | |
| 6,487,127 B2 | 11/2002 | Johnson et al. | |
| 7,092,280 B2 | 8/2006 | Joshi | |
| 7,269,055 B2 | 9/2007 | Lin et al. | |
| 7,324,368 B2 | 1/2008 | Wang et al. | |
| 7,460,400 B1 | 12/2008 | Kikuchi | |
| 7,706,174 B2 | 4/2010 | Pradhan et al. | |
| 7,915,657 B2 | 3/2011 | Mikami et al. | |
| 8,009,500 B2 | 8/2011 | Nii et al. | |
| 8,279,660 B2 | 10/2012 | Perisetty | |
| 2003/0012049 A1 | 1/2003 | Itoh et al. | |
| 2004/0125644 A1 | 7/2004 | Komatsuzaki | |
| 2007/0081407 A1 | 4/2007 | Maki et al. | |
| 2007/0127298 A1 | 6/2007 | Yamamura | |
| 2007/0236983 A1 | 10/2007 | Wang et al. | |
| 2007/0236985 A1 | 10/2007 | Edahiro et al. | |
| 2008/0117666 A1 | 5/2008 | Russell et al. | |

*Primary Examiner* — Douglas King
(74) *Attorney, Agent, or Firm* — Graeser Associates International Inc; Dvorah Graeser

(57) ABSTRACT

A memory cell with an internal supply feedback loop is provided herein. The memory cell includes a latch having two storage nodes Q and QB, and a supply node. A gating device couples the supply node of the latch to the supply voltage. The gating device is controlled by a feedback loop coming from storage node QB. Due to the aforementioned asymmetric topology, the writing of logic "1" and the writing of logic "0" are carried out differently. Contrary to standard SRAM cells, in the hold states, only the QB storage node presents a valid value of stored data. The feedback loop cuts off the supply voltage for the latch such that the latch is no longer an inverting latch. By cutting off the supply voltage at the stable hold states, while maintaining readability of the memory cell, leakage currents associated with the hold states are eliminated altogether.

15 Claims, 3 Drawing Sheets

300

(Existing Art)

(Existing Art)

ULTRA LOW POWER MEMORY CELL WITH A SUPPLY FEEDBACK LOOP CONFIGURED FOR MINIMAL LEAKAGE OPERATION

BACKGROUND

1. Technical Field

Embodiments of the present invention relate to semiconductor memory devices, and more particularly to an ultra low power consumption random access memory cell that is designed for minimal leakage operation.

2. Discussion of the Related Art

The ongoing demand for ultra low power consumption integrated circuits lead to sub-threshold and near-threshold operation of digital circuits. These approaches utilize very low supply voltages for digital circuit operation, decreasing the dynamic power quadratically, and sufficiently reducing leakage currents. As static power is often the primary factor in a system's power consumption, especially for low to medium performance systems, supply voltage scaling for minimization of leakage currents is essential. Optimal power-delay studies show that the Minimum Energy Point (MEP) is found in the sub-threshold region, where ultra-low power figures are achieved, at the expense of orders-of-magnitude loss in performance.

Low voltage operation of static Complementary Metal Oxide Semiconductor (CMOS) logic is quite straightforward, as its non-ratioed structure generally achieves robust operation under process variations and device mismatch. However, when ratioed designs are put under extreme conditions, maintaining functionality becomes challenging. Global variations change the drive strength ratio between n-channel MOS (nMOS) and p-channel MOS (pMOS) devices, often overcoming the sizing considerations taken into account when designing the circuits. Local mismatch brings an even tougher challenge, as the drive strength ratios between similar devices can be affected, and symmetrically designed circuits can easily lose functionality. At sub and near-threshold supply voltages, these fluctuations in drive strength are often more substantial than the effects of sizing and mobility. Thus a circuit that is fully operational at the typical process corner or when all devices are slow or fast, may not function at the fast nMOS/slow pMOS (aka FS) or fast pMOS/slow nMOS (aka SF) corners. Even if functionality is achieved at all process corners, local mismatch can cause failure.

FIG. 1 shows a circuit diagram of a standard six-transistor static SRAM cell 100 (write and read circuitry not shown here) according to the prior art. SRAM cell 100 is constructed of a pair of cross coupled static CMOS inverters, which are non-ratioed and therefore operational under process variations at very low supply voltages. However, accessing the data stored in the cell is a ratioed process, including a contention between a pull up and a pull down network in both read and write operations. During nominal strong inversion operation, sizing considerations are incorporated to ensure writeability and readability. However, at low voltages, process variations and mismatch cause a loss of functionality. Both theoretical and measured analysis show that standard SRAM blocks are limited to operating voltages of no lower than 700 mV.

FIG. 2 shows a circuit diagram of a standard eight-transistor static SRAM cell 200 according to the prior art. Standard eight-transistor static SRAM cell 200 includes the aforementioned six-transistor circuitry, a two port write configuration that includes two write circuitry (each for writing a logic '0' to either node Q or node QB via nMOS access devices) and a read circuitry with a decoupled read out path. Standard eight-transistor static SRAM cell 200 features read margins equivalent to its hold margins, however its write margins maintain the aforementioned 700 mV supply limitation.

BRIEF SUMMARY

One aspect of the present invention provides a memory cell with an internal supply feedback loop which significantly reduces leakage currents flowing through the latch, compared with standard eight-transistor static SRAM cell 200. The memory cell includes: a latch having a supply node, a ground node, a storage node Q, and a storage node QB; a gating device having a control node and further connected to a voltage supply and to the supply node of the latch; and a feedback loop connecting storage node QB with the control node of the gating device, wherein the ground node of the latch is connected to ground and wherein storage node Q and the storage node QB are connected each to a different write circuitry. Due to the aforementioned asymmetric topology, the writing of logic "1" and the writing of logic "0" into the memory cell are carried out differently. In contrary to a standard SRAM cell, in the hold states, only the QB storage node presents a valid value of stored data. This is because at steady state, both after writing logic "0" and after writing logic "1", the feedback loop cuts off the supply voltage for the latch such that the latch is no longer an inverting latch (but it is stable all the same). By cutting off the supply voltage at the stable hold states, while maintaining readability of the memory cell, leakage currents associated with the hold states characterizing the operation of static memory cells are eliminated altogether in the memory cell provided herein.

Additional, and/or other aspects and/or advantages of the embodiments of the present invention are set forth in the detailed description which follows; possibly inferable from the detailed description; and/or learnable by practice of the embodiments of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

The drawings together with the following detailed description make apparent to those skilled in the art how the invention may be embodied in practice.

DETAILED DESCRIPTION

The following description is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
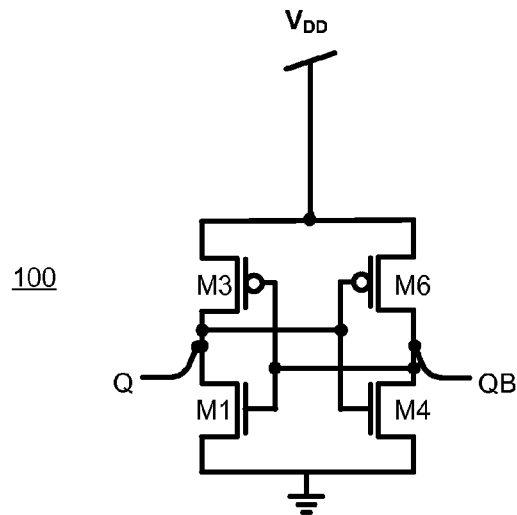
FIG. 1 is a circuit diagram of a conventional 6-transistor (6T) SRAM cell according to the existing art.
Figure 2:
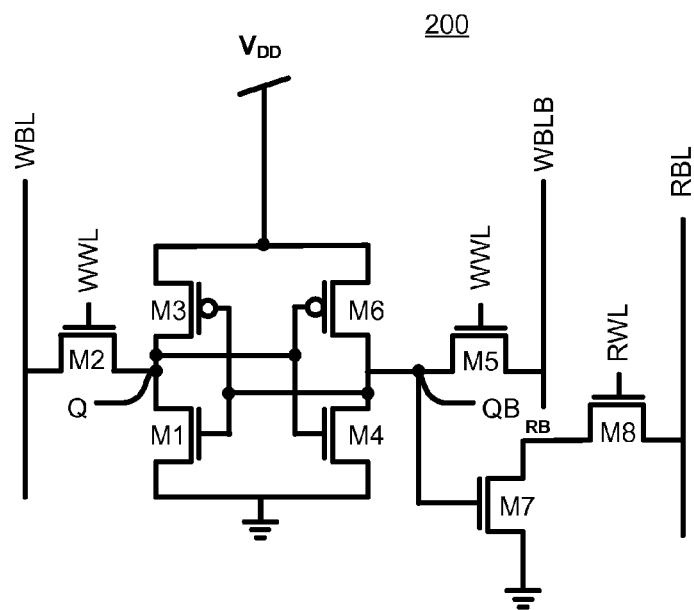
FIG. 2 is a circuit diagram of a conventional 8-transistor (8T) SRAM cell according to the existing art.
Figure 3A:
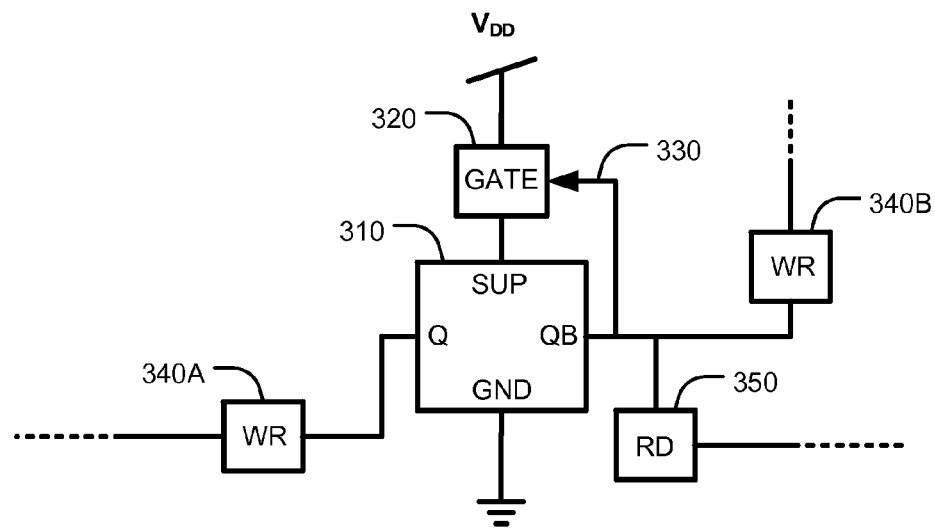
FIG. 3A is a schematic block diagram of a memory cell according to an embodiment of the present invention.

FIG. 3A is a schematic block diagram of a memory cell according to an exemplary non-limiting embodiment of the present invention. The memory cell may include a latch 310 having a storage node Q, a storage node QB, a supply node SUP, and a ground node GND. Supply node SUP is coupled via a gating device 320 to a supply voltage $V_{DD}$ and ground node GND is connected to ground. In addition, storage node QB is fed back via feedback loop 330 into a control node of gating device 320. The aforementioned asymmetric topology may be implemented in various ways as an integrated circuit as long as feedback loop 330 is internal to the memory cell from a topology perspective, i.e., the supply feedback is located between the supply voltage and the storage node QB.

In operation, and due to the aforementioned asymmetric topology, the writing of logic '1' and the writing of logic '0' into the memory cell are carried out differently. In contrary to a standard SRAM cell, in the hold states, only storage node QB presents a valid value of stored data. This is because in steady state, both after writing logic '0' and after writing logic '1', the feedback loop cuts off the supply voltage for the latch such that the latch is no longer an inverting latch (but it is stable all the same). By cutting off the supply voltage at the stable hold states, while maintaining readability of the memory cell, leakage currents associated with the hold states characterizing the operation of static memory cells are eliminated altogether in the memory cell according to the embodiments of the present invention.

Figure 3B:
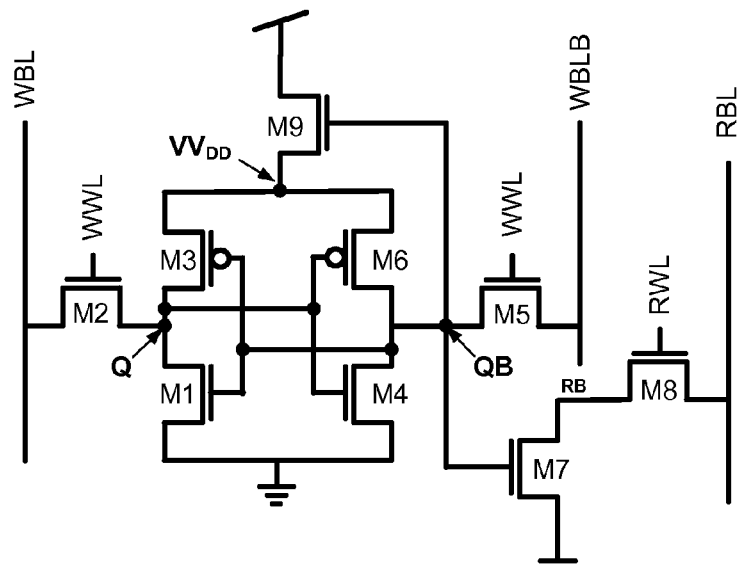
FIG. 3B is a circuit diagram of a memory cell according to an embodiment of the present invention.

FIG. 3B is a circuit diagram showing an exemplary, non-limiting memory cell 300 implementing the aforementioned topology according to some embodiments of the present invention. Although memory cell 300 resembles an eight transistor SRAM cell in a two port configuration, the introduction of the feedback loop results in the memory cell being not static. The bit storage property is maintained and carried out in a very different manner than carried out by static memory cells as detailed below after the following description of the exemplary implementation.

In a non-limiting example, memory cell 300 may be in implemented as an integrated circuit and includes the following: an nMOS device M1 having a gate, a source, and a drain; a first pMOS device M3 having a gate, a source, and a drain; a second nMOS device M4 having a gate, a source, and a drain; a second pMOS device M6 having a gate, a source, and a drain; and an nMOS gating device M9 having a gate, a source, and a drain, wherein the source of the second pMOS device M6, the drain of the second nMOS device M4, and the gates of the first nMOS device M1 and the first pMOS devices M3 are connected together forming a storage node QB, wherein the source of the first pMOS device M3, the drain of the first nMOS device M1, and the gates of the second nMOS device M4 and the second pMOS device M6 are connected together forming a storage node Q, wherein the sources of the first nMOS M1 device and the second nMOS device M6 are connected to ground, wherein the drains of the first pMOS device M3 and the second pMOS device M6 are connected to the source of the pMOS gating device M9, wherein the drain of the nMOS gating device M9 is connected to a supply voltage $V_{DD}$, and wherein the gate of the nMOS gating device M9 is connected to storage node Q. At a first glance, the aforementioned five devices M1, M3, M4, M6, and M9 implement a latch (two cross-coupled inverters) with a feedback loop from storage node QB to the supply. However, as will be explained below, the stability of the storage nodes is reached in a manned other than using an inverting latch as is the case in standard static memory cells.

In addition to the aforementioned topology, memory cell 300 may further include a first and a second write circuitry, each comprising an nMOS access device (M2 and M5 respectively) and configured to write a logic '0' to storage node Q and to storage node QB respectively. Finally, memory cell 300 may further include a read circuitry comprising two nMOS access devices M7 and M8 configured to read from node QB. It is understood that other devices may be used in order to implement the read and write circuitries. For example, pMOS devices may be used to implement the write circuitries. In operation, due to the aforementioned asymmetric topology, the writing into the cell is associated with two completely different flows realizing each one of the writing states, being writing logic '1' and writing logic '0'. These flows are described in detail below.

Figure 4A:
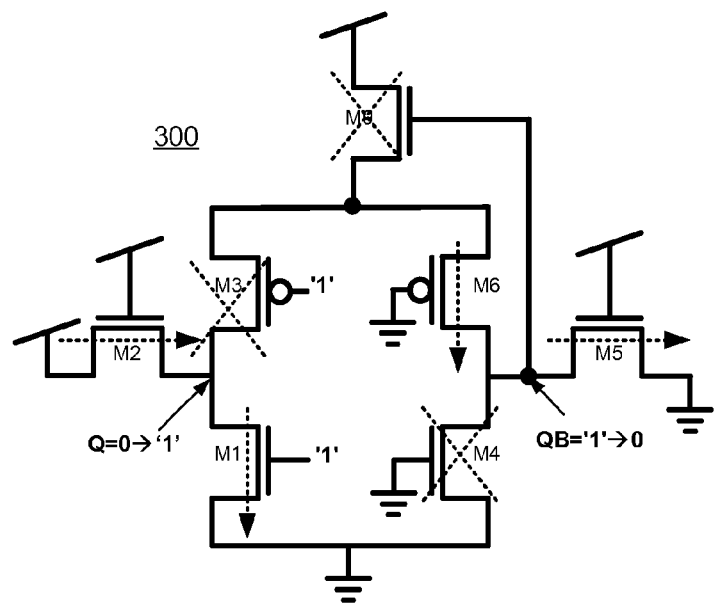
FIGS. 4A and 4B are circuit diagrams showing writing logic "1" and writing logic "0", respectively, into the memory cell according to some embodiments of the present invention.

FIG. 4A is a circuit diagram illustrating the operation of writing logic '1' into cell 300. Writing logic '1' is realized by actually writing logic '0' to QB while at the steady state Q is only partially charged, whereas storage node QB is maintained a stable state at logic '0'. As discussed earlier, there is no contradiction in both storage nodes Q and QB having low values since the supply to the supply node of the inverters is cut off and the latch does not serve as an inverting latch anymore. However, the latch still maintains its storage property due to the following explanation: in writing '1' to storage node Q, storage node Q is charged to a sub $V_{DD}$ voltage (the exact value depends on the $V_T$ of access device M2). At the same time, gating device M9 is cut off and so storage node Q is gradually discharged (thus presenting so-called wrong value at the Q side). However, at the same time, storage node QB is discharged to ground, as a steady state, thus presenting a stable logic '0'.

A further analysis shows that the pull down of storage node QB, affected by nMOS device M4 remains stronger than the pull down of nMOS device M1 of storage node Q. Stability is maintained since the only potential pull up that may affect storage node QB is by leakage currents which are sufficiently low and have no effect on stability.

The aforementioned analysis illustrates a completely different process than in an existing 6T SRAM cells. These standard cells "flip" whenever the positive feedback is enabled by storage node Q going below the inverter's trip point being around $V_{DD}/2$. As explained above, in the memory cell 300 the inverters are inoperative and so there is no trip point and therefore storage node QB stays discharged at logic '0' while storage node Q shows a 'wrong' value which is not read and so does not affect the correctness of the cell as a memory cell.

Figure 4B:
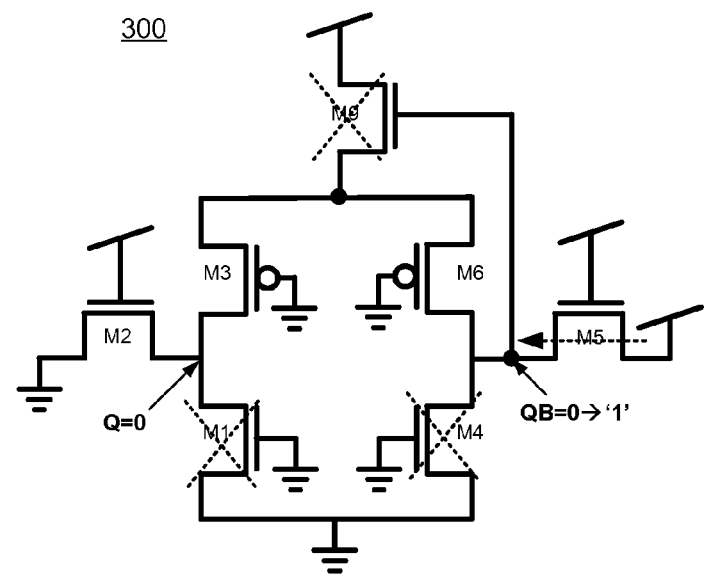

FIG. 4B is a circuit diagram illustrating the operation of writing logic '0' into cell 300, i.e. setting storage node Q to '0' and setting storage node QB to logic '1'. Allegedly, a high value at storage node QB would open nMOS gating device M9. However, an analysis of the circuit reveals a different process as follows. Upon writing logic '0' to storage node Q, when storage node Q has been completely discharged, pMOS device M6 is on with a low resistance, such that the voltages at the source of nMOS gating device M9 and at storage node QB are equivalent. This situation results in a very low gate-to-source voltage for gating device M9 (VGS→0). Thus, since the overdrive ($V_{GS}$-$V_T$) of gating device M9 is always zero, gating device M9 is never open during a write operation. Therefore, during the write operation, any initial state that is set to storage node QB is maintained since there is no cause for a discharge. Consequently, it would be advantageous to writing as high a value as possible into storage node QB. In accordance with the aforementioned explanation, storage node QB is written to a sub $V_{DD}$ value through access transistor M5 the exact value depends on the $V_T$ of access device M5). Since pMOS device M6 is open, this voltage propagates to the drain of gating device M9. At the same time, the pull down nMOS M1 is closed because storage node Q=0. Hence, since gating device M9 is closed and storage node Q is being pulled down strongly, Storage node Q will stay discharged, even if there is some noise on storage node Q. On the other hand, storage node QB stays at its steady state level because nMOS M4 is strongly closed. It may become clear from the aforementioned analysis that in order to ensure stability of storage QB at the leakage current through gating device M9 should be stronger than the current leakage through closed nMOS M4.

The inventors have discovered, during simulations and measurements carried out on an exemplary and non-limiting implementation of memory cell 300, that in order to ensure the aforementioned requirement, it would be advantageous to select gating device M9 as an LVT device (a device with a low threshold voltage) and pull down nMOS device M4 as an HVT device (a device with a high threshold voltage) thus ensuring that leakage through gating device M9 is much stronger than the leakage current through nMOS device M4. It is however noted, that other embodiments may require other constraints on the properties of gating device M9 or any of the other devices M1-M8. It is further noted that other requirements may be needed, in implementing the present invention in various processes, or architectures.

From the foregoing it will be appreciated that, although specific embodiments of the invention have been described herein for purposes of illustration, various modifications may be made without deviating from the spirit and scope of the invention.

What is claimed is:

1. A memory cell comprising:
   a latch having a supply node, a ground node, a storage node Q, and a storage node QB;
   a gating device having a control node and further connected to a voltage supply and to the supply node of the latch; and
   a feedback loop directly connecting the storage node QB with the control node of the gating device,
   wherein the ground node of the latch is connected to ground and wherein the storage node Q and the storage node QB are each connected to a separate write circuitry,
   wherein responsive to a writing of a logic "0" or a logic "1" into the memory cell, the feedback loop and the gating device are configured to cut off the voltage supply to the latch when the storage nodes reach steady state in which only one of the storage nodes stores a valid value while maintaining readability, and wherein leakage currents through the latch are reduced in the steady state.

2. The memory cell according to claim 1, wherein in the steady states, the supply to the latch is cut off rendering the latch non-inverting.

3. The memory cell according to claim 1, wherein the latch comprises a first inverter comprising a first nMOS device and a first pMOS device, the first inverter having a ground node connected to ground and a supply node; and a second inverter, comprising a second nMOS device and a second pMOS device, the second inverter being cross-coupled with the first inverter and having a supply node connected to the supply node of the first inverter, and a ground node connected to ground, wherein both of the inverters have a common storage node Q and a common storage node QB; and wherein the gating device and the feedback loop comprise an nMOS gating device having a gate connected to storage node QB node, a source node connected to the supply nodes of the inverters, and a drain node connected to a supply voltage.

4. The memory cell according to claim 3, further comprising a first and a second write circuitry, each comprising at least one access device and configured to write logic '0' and logic '1' to the storage nodes, and wherein upon writing logic '1', in the steady state storage node Q is partially discharged and storage node QB is grounded, and wherein upon writing logic '0', in the steady state storage node Q is grounded and storage node QB maintains the logic '1'.

5. The memory cell according to claim 3, wherein the nMOS gating device is configured to have a low threshold voltage level, and wherein the second nMOS device is configured to have a high threshold voltage level, wherein a source node of the second nMOS device is connected to storage node QB.

6. The memory cell according to claim 4, wherein the pMOS devices are pMOS transistors and wherein the nMOS devices are nMOS transistors.

7. The memory cell according to claim 4, wherein the memory cell is a cell within an array of similar memory cells all forming a part of an integrated circuit.

8. A memory cell comprising:
   a first nMOS device having a gate, a source, and a drain;
   a first pMOS device having a gate, a source, and a drain;
   a second nMOS device having a gate, a source, and a drain;
   a second pMOS device having a gate, a source, and a drain; and
   an nMOS gating device having a gate, a source, and a drain,
   wherein the source of the second pMOS device, the drain of the second nMOS device, and the gates of the first nMOS and the first pMOS devices are connected together forming a storage node QB,
   wherein the source of the first pMOS device, the drain of the first nMOS device, and the gates of the second nMOS and the second pMOS devices are connected together forming a storage node Q,
   wherein the sources of the first and the second nMOS devices are connected to ground,
   wherein the drains of the first and the second pMOS devices are connected to the source of the gating device,
   wherein the drain of the nMOS gating device is directly connected to a supply voltage, and
   wherein the gate of the nMOS gating device is connected to the storage node QB.

9. The memory cell according to claim 8, wherein upon writing logic '0' or logic "1" to the memory cell, the nMOS gating device is closed, maintaining the storage node QB at a value to which the storage node QB is set, during the writing.

10. The memory cell according to claim 8, wherein upon writing logic '0' to the storage node QB, the gating nMOS device is cut off, so that the storage node Q is gradually discharged and wherein the storage node QB is grounded in a steady state.

11. The memory cell according to claim 8, wherein upon writing logic '1' to the storage node QB, the gating nMOS device is cut off, so that the storage node Q is grounded and wherein the storage node QB is maintained at logic '1' in a steady state.

12. The memory cell according to claim 8, wherein the nMOS gating device and the second nMOS device are selected such that leakage currents through the nMOS gating device are significantly higher than leakage currents through the second nMOS device.

13. The memory cell according to claim 8, wherein the nMOS gating device is configured to have a low threshold voltage level, and wherein the second nMOS device is configured to have a high threshold voltage level.

14. The memory cell according to claim 8, wherein the pMOS devices are pMOS transistors and wherein the nMOS devices are nMOS transistors.

15. The memory cell according to claim 8, wherein the memory is a cell within an array of similar memory cells all forming a part of an integrated circuit.

* * * * *